United States Patent
Iwai et al.

(10) Patent No.: US 8,241,422 B2
(45) Date of Patent: Aug. 14, 2012

(54) GALLIUM NITRIDE SINGLE CRYSTAL GROWING METHOD AND GALLIUM NITRIDE SINGLE CRYSTAL

(75) Inventors: Makoto Iwai, Kasugai (JP); Katsuhiro Imai, Nagoya (JP); Minoru Imaeda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 392 days.

(21) Appl. No.: 10/594,846

(22) PCT Filed: Mar. 30, 2005

(86) PCT No.: PCT/JP2005/006692
§ 371 (c)(1),
(2), (4) Date: Nov. 8, 2006

(87) PCT Pub. No.: WO2005/095682
PCT Pub. Date: Oct. 13, 2005

(65) Prior Publication Data
US 2007/0209575 A1    Sep. 13, 2007

(30) Foreign Application Priority Data
Mar. 31, 2004   (JP) ................. 2004-103093

(51) Int. Cl.
*C30B 25/12*    (2006.01)
(52) U.S. Cl. ............. 117/68; 117/84; 117/89; 117/97
(58) Field of Classification Search ............ 117/68, 117/97, 73–77, 81–89; 257/189
See application file for complete search history.

(56) References Cited

U.S. PATENT DOCUMENTS

| | | | |
|---|---|---|---|
| 5,868,837 A * | 2/1999 | DiSalvo et al. | 117/2 |
| 6,398,867 B1 | 6/2002 | D'Evelyn et al. | 117/11 |
| 6,592,663 B1 * | 7/2003 | Sarayama et al. | 117/68 |
| 6,780,239 B2 * | 8/2004 | Sarayama et al. | 117/36 |
| 6,861,130 B2 * | 3/2005 | D'Evelyn et al. | 428/220 |
| 6,949,140 B2 * | 9/2005 | Sarayama et al. | 117/81 |
| 7,001,457 B2 * | 2/2006 | Sarayama et al. | 117/74 |
| 7,220,311 B2 * | 5/2007 | Iwata et al. | 117/73 |

(Continued)

FOREIGN PATENT DOCUMENTS

GB    2 326 160 A    12/1998

(Continued)

OTHER PUBLICATIONS

Kawamura, F. et al, "Growth of a Large GaN Single Crystal Using the Liquid Phase Epitaxy (LPE) Technique," Jpn. J. Appl. Phys., vol. 42 (2003), pp. L4-L6.

*Primary Examiner* — Matthew Song
*Assistant Examiner* — Felisa C Hiteshew
(74) *Attorney, Agent, or Firm* — Burr & Brown

(57) ABSTRACT

It is provided a method of growing gallium nitride single crystal of good quality with a high productivity, in the growth of gallium nitride single crystal by Na-flux method. Gallium nitride single crystal is grown using flux 8 containing at least sodium metal. Gallium nitride single crystal is grown in atmosphere composed of gases mixture "B" containing nitrogen gas at a pressure of 300 atms or higher and 2000 atms or lower. Preferably, the nitrogen partial pressure in the atmosphere is 100 atms or higher and 2000 atms or lower. Preferably, the growth temperature is 1000° C. or higher and 1500° C. or lower.

6 Claims, 1 Drawing Sheet

U.S. PATENT DOCUMENTS

| | | | |
|---|---|---|---|
| 7,227,172 B2* | 6/2007 | Kitaoka et al. | 257/11 |
| 7,250,640 B2* | 7/2007 | Sarayama et al. | 257/189 |
| 7,261,775 B2* | 8/2007 | Iwata et al. | 117/81 |
| 7,368,015 B2* | 5/2008 | D'Evelyn et al. | 117/224 |
| 7,435,295 B2* | 10/2008 | Kitaoka et al. | 117/64 |
| 7,449,064 B2* | 11/2008 | Iwai et al. | 117/81 |
| 7,531,038 B2* | 5/2009 | Sarayama et al. | 117/73 |
| 2002/0078881 A1* | 6/2002 | Cuomo et al. | 117/84 |
| 2002/0086534 A1* | 7/2002 | Cuomo et al. | 438/689 |
| 2002/0158267 A1* | 10/2002 | Kelsey, Jr. | 257/103 |
| 2002/0175338 A1* | 11/2002 | Sarayama et al. | 257/95 |
| 2004/0134413 A1* | 7/2004 | Iwata et al. | 117/2 |
| 2004/0144300 A1* | 7/2004 | Kitaoka et al. | 117/2 |
| 2004/0262630 A1 | 12/2004 | Kitaoka et al. | |
| 2006/0037529 A1* | 2/2006 | D'Evelyn et al. | 117/36 |
| 2006/0051942 A1* | 3/2006 | Sasaki et al. | 438/483 |
| 2006/0096521 A1* | 5/2006 | D'Evelyn et al. | 117/2 |
| 2007/0194408 A1* | 8/2007 | Iwata et al. | 257/613 |
| 2007/0209575 A1* | 9/2007 | Iwai et al. | 117/78 |
| 2007/0296061 A1* | 12/2007 | Sasaki et al. | 257/615 |
| 2008/0302297 A1* | 12/2008 | Ichimura et al. | 117/73 |
| 2009/0000538 A1* | 1/2009 | Iwai et al. | 117/19 |
| 2009/0013924 A1* | 1/2009 | Iwai et al. | 117/64 |
| 2009/0120354 A1* | 5/2009 | Sarayama et al. | 117/203 |
| 2009/0140287 A1* | 6/2009 | Fujiwara et al. | 257/103 |

FOREIGN PATENT DOCUMENTS

| | | |
|---|---|---|
| JP | 2002-293696 | 10/2002 |
| JP | 2003-511326 | 3/2003 |
| JP | 2003-292400 | 10/2003 |
| JP | 2005-8444 | 1/2005 |
| WO | WO01/24921 | 4/2001 |
| WO | WO2004/013385 | 2/2004 |

\* cited by examiner

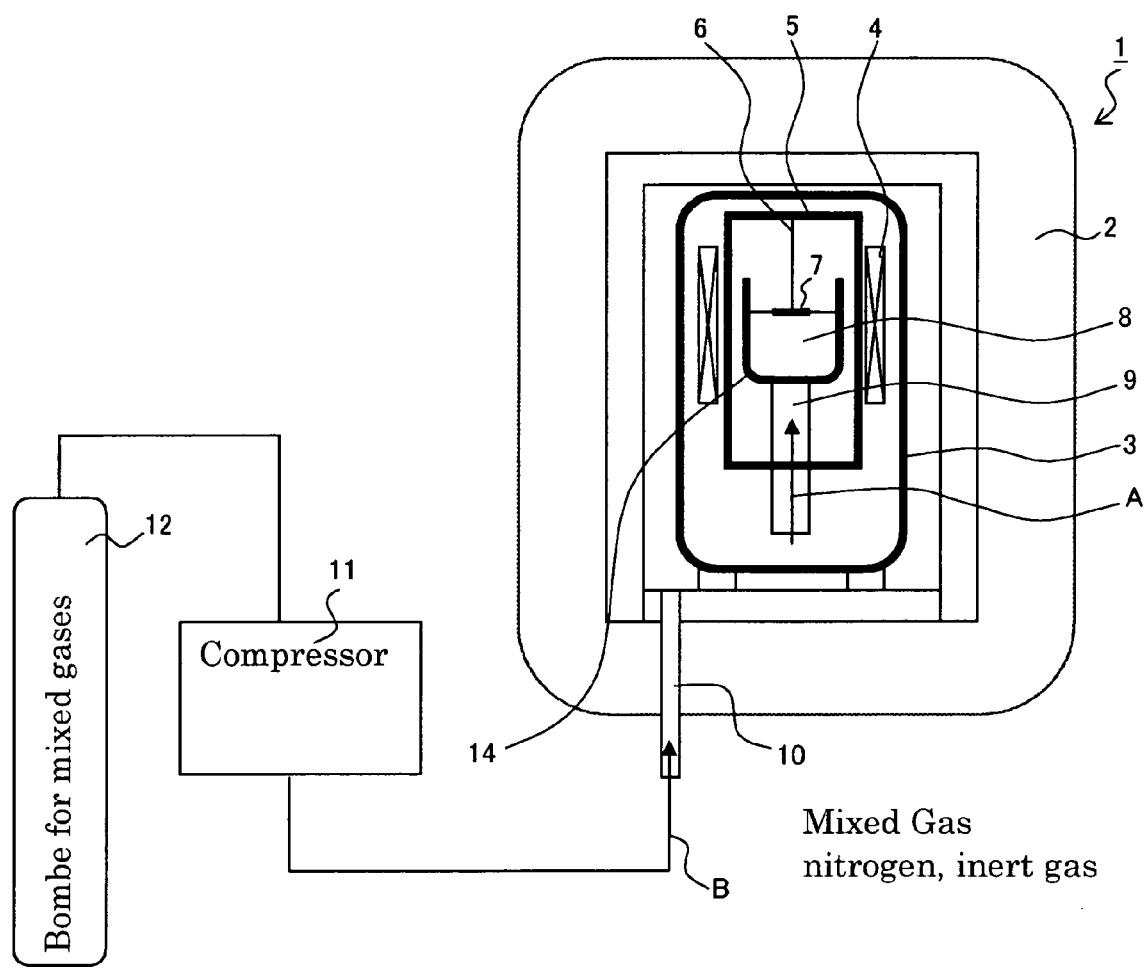

GALLIUM NITRIDE SINGLE CRYSTAL GROWING METHOD AND GALLIUM NITRIDE SINGLE CRYSTAL

The present application is based on International Application PCT/JP2005/006692, filed Mar. 30, 2005, which claims priority to Japanese Patent Application P2004-103093, filed Mar. 31, 2004, the entire contents of which are hereby incorporated by reference.

FIELD OF THE INVENTION

The present invention relates to a method of growing gallium nitride single crystals by means of so-called Na-flux method.

BACKGROUND OF THE INVENTION

Thin films of gallium nitride crystals has attracted much attention for use in superior blue light emitting devices, which have been commercialized as light-emitting diodes and are expected as semiconductor laser device emitting blue-purple rays for optical pickups. As methods for growing gallium nitride single crystals by Na-flux method, for example, according to "Jpn. J. Appl. Phys." Vol. 42, (2003) page L4 to L6, the atmospheric pressure was 50 atms in the case of using nitrogen atmosphere and the total pressure was 5 atms in the case of using gas mixture atmosphere of 40 percent of ammonia and 60 percent of nitrogen.

Further, for example, according to Japanese patent publication 2002-293696A, gas mixture of nitrogen and ammonia is used to maintain a pressure of 10 to 100 atms. According to Japanese patent publication 2003-292400A, the pressure of atmosphere during the growing process is lower than 100 atms, and 2, 3 or 5 MPa (about 20, 30 50 atms) in the examples. Further, according to each of the prior arts, the growing temperature is lower than 1000° C. and lower than 850° C. in all the examples.

SUMMARY OF THE INVENTION

However, according to these methods, the productivity of gallium nitride single crystal is low, so that it is demanded a method of growing gallium nitride single crystals of good quality at a high productivity.

An object of the present invention is to provide a method of growing a gallium nitride single crystal of good quality at a high productivity in a production of the single crystal by means of Na-flux method.

The present invention provides a method of growing gallium nitride single crystal using at least a flux comprising sodium metal, said method comprising the step of:

growing said gallium nitride single crystal in an atmosphere comprising gas mixture comprising nitrogen gas and under a total pressure of 300 atms or higher and 2000 atms or lower.

The present invention further provides a gallium nitride single crystal produced according to the above method.

The present inventors have used a system capable of applying a higher temperature and larger pressure, such as a hot isostatic press (HIP) system, compared with systems used in prior Na-flux method. They have thus tried to control the total pressure in a range of 300 atms or higher and 2000 atms or lower and the partial pressure of nitrogen. It was thereby proved that the single crystals of good quality can be obtained in a higher temperature range such as 900 to 1500° C. compared with those in prior arts, and attained the present invention.

BRIEF DESCRIPTION OF THE DRAWINGS

FIG. 1 is a drawing schematically showing a growing system 1 usable in one embodiment of the present invention.

DETAILED DESCRIPTION OF THE INVENTION

According to the present invention, gallium nitride single crystal is grown using a flux containing at least sodium metal. A raw material of gallium is mixed into the flux. Such raw material of gallium includes gallium pure metal, gallium alloys and gallium compounds. Gallium pure metal is preferred on the viewpoint of handling.

The flux may contain a metal other than sodium, such as lithium, calcium and potassium. The ratio of amount of the raw material of gallium to that of the raw material of flux, such as sodium, may be appropriately selected, and it is generally considered that an excess amount of Na may be used. Of course, it is not a limiting requirement.

According to the present invention, gallium nitride single crystal is grown in atmosphere comprising gas mixture comprising nitrogen gas, under a total pressure in a range of 300 atms or higher and 2000 atms or lower. It is possible to facilitate the growth of crystal nuclei and thus to grow gallium nitride single crystal of good quality in a high temperature range of 900° C. or higher, more preferably 950° C. or higher. Although the reasons are not clear, it may be speculated that the density of the high pressure gas is made near that of growing solution containing at least sodium metal to facilitate the convection so that nitrogen can be efficiently dissolved into the growing solution. Further, when the total pressure of the atmosphere exceeds 2000 atms, the density of the high pressure gas and that of the growing solution may be nearer, so that it becomes difficult to hold the growing solution in a crucible and thus not preferred. The total pressure is thus made 2000 atms or lower. The total pressure may preferably be 1500 atms or lower and more preferably be 1200 atms or lower.

TABLE 1

Densities of various kinds of materials (g/cm$^3$)

| | Sodium metal | Nitrogen | Argon |
|---|---|---|---|
| 800° C. · 1 atm | 0.75 | 0.0003 | 0.0004 |
| 927° C. · 300 atm | | 0.08 | 0.11 |
| 927° C. · 1000 atm | | 0.21 | 0.33 |
| 927° C. · 2000 atm | | 0.3 (speculation) | 0.5 (speculation) |

According to the present invention, the partial pressure of nitrogen in the atmosphere during the growth may preferably be 100 atms or higher and 2000 atms or lower. The partial pressure is made 100 atms or higher so that it becomes possible to facilitate the generation of nuclei and to grow gallium nitride single crystal of good quality, for example, in a high temperature range of 1000° C. or higher. On the viewpoint, the partial pressure of nitrogen may preferably be 120 atms or higher, more preferably be 200 atms or higher and most preferably be 300 atms or higher. Further, the partial pressure may preferably be 1000 atms or lower on the practical viewpoint.

Gas contained in the atmosphere other than nitrogen is not particularly limited, and may preferably be an inert gas. Argon, helium and neon are particularly preferred. The partial pressure of the gas(es) other than nitrogen is a value obtained by subtracting the partial pressure of nitrogen from the total pressure.

According to the present invention, the growing temperature of gallium nitride single crystal may preferably be 950° C. or higher and more preferably be 1000° C. or higher. It is possible to grow gallium nitride single crystal of good quality even in such high temperature range. Further, the growth at a high temperature could improve the productivity.

Although the upper limit of the growing temperature of gallium nitride single crystal is not particularly defined, if the growing temperature is too low, the crystal growth would be interrupted. On the viewpoint, the growing temperature may preferably be 1500° C. or lower and more preferably be 1200° C. or lower.

The actual growing procedure to perform the present invention is not particularly limited. According to a preferred embodiment, a seed crystal is fixed at a predetermined position and a crucible containing flux is moved upwardly, so that the seed crystal contacts the surface of the flux. At a high pressure, the density of the gas becomes large, and the temperature rises as the upper part of a jacket. It is thus proved that moving parts may preferably be positioned at lower positions and the crucible may preferably be moved upwardly or rotated on the viewpoint of controlling the temperature distribution or the gas convection. These formations proved to be good for the growth of the single crystal.

Further, according to a preferred embodiment, a crucible containing the flux is contained in a pressure vessel and heated under a high pressure using a hot isostatic pressing system. According to this embodiment, the atmospheric gas containing nitrogen is pressed to a predetermined pressure and supplied into the pressure vessel. The total pressure and the partial pressure of nitrogen in the pressure vessel are controlled FIG. 1 is a diagram schematically showing a system 1 of growing gallium nitride single crystal usable according to one embodiment of the present invention. A jacket 3 is fixed in a pressure vessel 2 of an HIP (hot isostatic press) system. A crucible 14 is mounted in the jacket 3. The crucible 14 is fixed on a supporting rod 9, so that it can be moved upwardly and downwardly as shown in arrows "A". At least sodium constituting the flux and raw material containing gallium are contained in the crucible 14.

Gas mixture having a predetermined composition is filled in a bombe 12 for gas mixture. The gas mixture is pressed with a pressing machine 11 to a predetermined pressure, and supplied into the pressure vessel 2 through a supply tube 10 as arrows "B". Nitrogen in the atmosphere provides a nitrogen source and the inert gas such as argon gas prevents the evaporation of sodium. The pressure is monitored by means of a pressure gauge not shown.

A heater 4 is mounted around the crucible 14 and jacket 3, so that the growing temperature in the crucible can be controlled.

A substrate 7 of a seed crystal is lifted with and fixed to the supporting rod 6 over the crucible 14. Predetermined raw materials are contained in the crucible 14, heated and molten to generate flux 8. The crucible 14 is then driven upwardly as an arrow "A" so that the seed crystal substrate 7 is contacted with the surface of and immersed in the flux 8. The temperature of the crucible 14 is maintained at a predetermined value for a predetermined time period to form a film of gallium nitride single crystal on the seed crystal 7. The crucible 14 can be rotated by rotating the supporting rod 9. The crucible 14 is then driven downwardly to cool the seed crystal 7 and the gallium nitride single crystal.

The material of a substrate for epitaxillary growing gallium nitride crystal is not particularly limited. Such materials include sapphire, AlN template, GaN template, SiC single crystal, MgO single crystal, spinel ($MgAl_2O_4$), and perovskite composite oxides such as $LiAlO_2$, $LiGaO_2$, $LaAlO_3$, $LaGaO_3$ and $NdGaO_3$. It can be further used a composite oxide of perovskite structure and of cubic system having a composition of

$[A_{1-y}(Sr_{1-x}Ba_x)_y][Al_{1-z}Ga_z)_{1-u}·D_u]O_3$ ("A" represents a rare earth element; "D" represents one or more element(s) selected from the group consisting of niobium and tantalum; "y"=0.3 to 0.98: "x"=0-1: "z"=0 to 1: "u"=0.15 to 0.49: x+z=0.1 to 2). Further, SCAM ($ScAlMgO_4$) may be used. It may be further used a self-standing substrate of GaN produced by HVPE method or the like.

EXAMPLES

Example 1

The system shown in FIG. 1 was used to grow a film of gallium nitride single crystal on a seed crystal 7, according to the procedures described referring to FIG. 1.

Specifically, an HIP (hot isostatic pressing) system of yoke frame type was used. A cylindrical alumina crucible 14 having a diameter of 100 millimeter and a height of 120 millimeter was inserted into the pressure vessel 2. 200 g of sodium metal and 200 g of gallium metal were supplied into the crucible 14. Gas mixture having a nitrogen content of 40 percent (the balance argon) was supplied from the bombe 12, pressurized to 1200 atms with a pressing machine and heated to 1000° C. The nitrogen partial pressure at this stage was 480 atms. After the crucible was held at 1000° C. for 24 hours, it was elevated to insert an AlN template 7 having a diameter of 2 inches into the flux 8 and held further for 100 hours. As a result, it was grown GaN single crystal having a thickness of 5 mm and a diameter of 2 inches. An AlN template means an epitaxial thin film of AlN single crystal formed on a substrate of sapphire single crystal. The film thickness of the AlN thin film was made 1 micron. The evaporation of sodium metal was hardly observed.

Example 2

The experiment was performed according to the same procedure as the example 1, except that it was used gas mixture having a nitrogen content of 40 percent (balance argon) and of a total pressure of 300 atms. The partial pressure at this stage was 120 atms. It was thus grown a GaN single crystal having a thickness of about 2.5 mm and a diameter of 2 inches. Although a trace amount of sodium metal was evaporated, it did not substantially affect the growth.

Example 3

The experiment was performed according to the same procedure as the example 1, except that the growing temperature was made 850° C. Many GaN single crystals having sizes of 1 to 3 mm were grown on an inner wall face of the crucible and on the AlN template, so that a large single crystal was not obtained.

Example 4

The experiment was performed according to the same procedure as the example 1, except that 100 g of gallium metal, 100 g of sodium metal and 0.5 g of lithium metal were used and pure nitrogen gas at a total pressure of 300 atms was used. The partial pressure of nitrogen was 300 atms. It was thus grown GaN single crystal having a thickness of 4 mm and a diameter of 2 inches. Although a trace amount of sodium metal was evaporated, it did hardly influenced upon the growth.

Example 5

The experiment was performed according to the same procedure as the example 4, except that gas mixture having a nitrogen content of 50 percent (balance argon) was used and the growth temperature was made 1200° C. The total pressure of the atmosphere was 1200 atms and the partial pressure of nitrogen was 600 atms. It was thus grown GaN single crystal having a thickness of about 5 mm and a diameter of 2 inches. Although a trace amount of sodium metal was evaporated, it did hardly influenced upon the growth.

Comparative Example 1

The experiment was performed according to the same procedure as the example 1, except that the total pressure was made 200 atms and the partial pressure of nitrogen was made 80 atms. The AlN template was molten so that GaN single crystal could not be obtained. Further, a part of Na in the raw materials was evaporated so that the height of the solution was changed.

The present invention has been explained referring to the preferred embodiments, however, the present invention is not limited to the illustrated embodiments which are given by way of examples only, and may be carried out in various modifications and changes without departing from the scope of the attached claims.

The invention claimed is:

1. A method of growing a gallium nitride single crystal using a flux comprising at least sodium metal, said method comprising:
    growing said gallium nitride single crystal in an atmosphere comprising nitrogen gas and having a total pressure of 300 atms to 1200 atms and at a temperature of 900° C. to 1200° C., said atmosphere having a nitrogen pressure of 120 atms to 600 atms, wherein the gallium nitride single crystal is grown at a rate of at least 25 µm/hr.

2. The method of claim 1, wherein said crystal is grown at a temperature of 950° C. to 1200° C.

3. The method of claim 1, further comprising the step of elevating a crucible containing said flux until a seed crystal contacts said flux.

4. The method of claim 3, further comprising the step of driving the crucible downward after a predetermined amount of time, to separate the seed crystal from said flux.

5. The method of claim 1, wherein said gallium nitride single crystal is grown using a system for hot isostatic pressing.

6. The method of claim 1, wherein the gallium nitride single crystal is grown on a seed crystal having a lateral dimension and the gallium nitride single crystal has the same lateral dimension.

* * * * *